United States Patent [19]

Schultz, Jr. et al.

[11] Patent Number: 5,012,391

[45] Date of Patent: Apr. 30, 1991

[54] MOLDED ELECTRICAL INTERCONNECTION SYSTEM

[75] Inventors: Albert N. Schultz, Jr., Hiddenite; Paul D. Zakary, Winston-Salem, both of N.C.

[73] Assignee: AMP Incorporated, Harrisburg, Pa.

[21] Appl. No.: 395,382

[22] Filed: Aug. 17, 1989

[51] Int. Cl.$^5$ .................... H02B 1/20; H01R 9/09
[52] U.S. Cl. .................... 361/428; 29/850; 174/251; 307/147; 361/332; 361/406; 361/426
[58] Field of Search .............. 307/10.1, 147; 361/332, 361/334, 346, 355, 358, 360, 361, 395, 399, 421, 426, 406, 428, 409, 417, 419; 174/251, 254, 260, 261, 267; 439/43, 76, 395, 397, 400, 401; 29/850, 854, 857

[56] References Cited

U.S. PATENT DOCUMENTS

| | | | |
|---|---|---|---|
| 2,592,552 | 4/1952 | De Florez | 361/346 |
| 3,659,340 | 5/1972 | Giedd | 174/251 |
| 4,142,287 | 3/1979 | Grabbe | 29/628 |
| 4,158,745 | 6/1979 | Keller | 174/52 FP |
| 4,168,404 | 9/1979 | Lockard | 200/1 R |
| 4,197,636 | 4/1980 | Osanai | 29/882 |
| 4,252,864 | 2/1981 | Coldren | 428/571 |
| 4,360,858 | 11/1982 | Fahling | 361/380 |
| 4,374,080 | 2/1983 | Schroeder | 264/102 |
| 4,387,509 | 6/1983 | Dechelette | 29/850 |
| 4,445,736 | 5/1984 | Hopkins | 339/17 CF |
| 4,577,917 | 3/1986 | Nashimoto et al. | 339/150 T |
| 4,593,452 | 6/1986 | Keahey et al. | 29/564.6 |
| 4,600,971 | 7/1986 | Rose et al. | 361/421 |
| 4,611,262 | 9/1986 | Galloway et al. | 361/421 |
| 4,632,798 | 12/1986 | Eickman et al. | 264/272.17 |
| 4,641,225 | 2/1987 | Reichle | 361/428 |
| 4,659,157 | 4/1987 | Nigg et al. | 339/18 R |
| 4,684,765 | 8/1987 | Beck et al. | 174/68.5 |
| 4,767,338 | 8/1988 | Dennis | 439/76 |
| 4,783,906 | 11/1988 | Gingerich et al. | 29/827 |
| 4,797,112 | 1/1989 | Weisenburger | 439/55 |
| 4,820,189 | 4/1989 | Sergeant et al. | 439/395 |

OTHER PUBLICATIONS

"Design Insert-Molded Parts" article in Machine Design dated 9/22/88.
Advertisement "Eight Good Reasons for RIM" published by Mohax.

Primary Examiner—Gerald P. Tolin
Attorney, Agent, or Firm—Allan B. Osborne

[57] ABSTRACT

A circuit panel subassembly suitable for use in an electromechanical apparatus includes a plurality of wires formed within an electrically conductive grid imbedded within a reaction injection molded panel which forms a part of the housing of the electromechanical apparatus. Wires are deployed in a pattern by using a wire organizing frame and the electrically conductive grid and the frame are subsequently imbedded in a reaction injection molded panel. Terminals attached to the ends of the wires remain exposed at spaced apart locations where components are to be mounted. Separate connector housings can be attached to the panel over the exposed terminals and other components or matable connectors can be attached thereto. The entire apparatus can be constructed robotically.

1 Claim, 9 Drawing Sheets

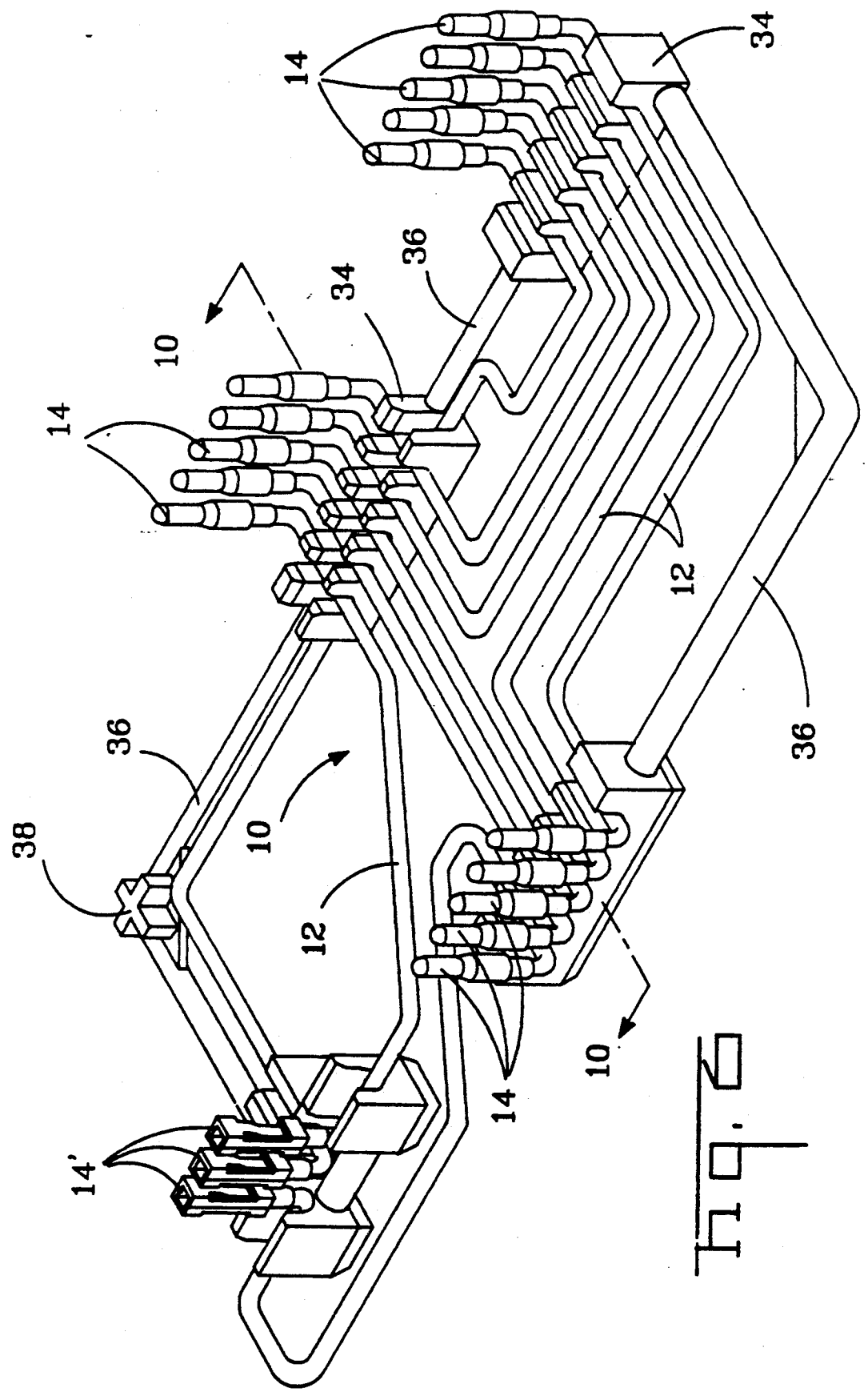

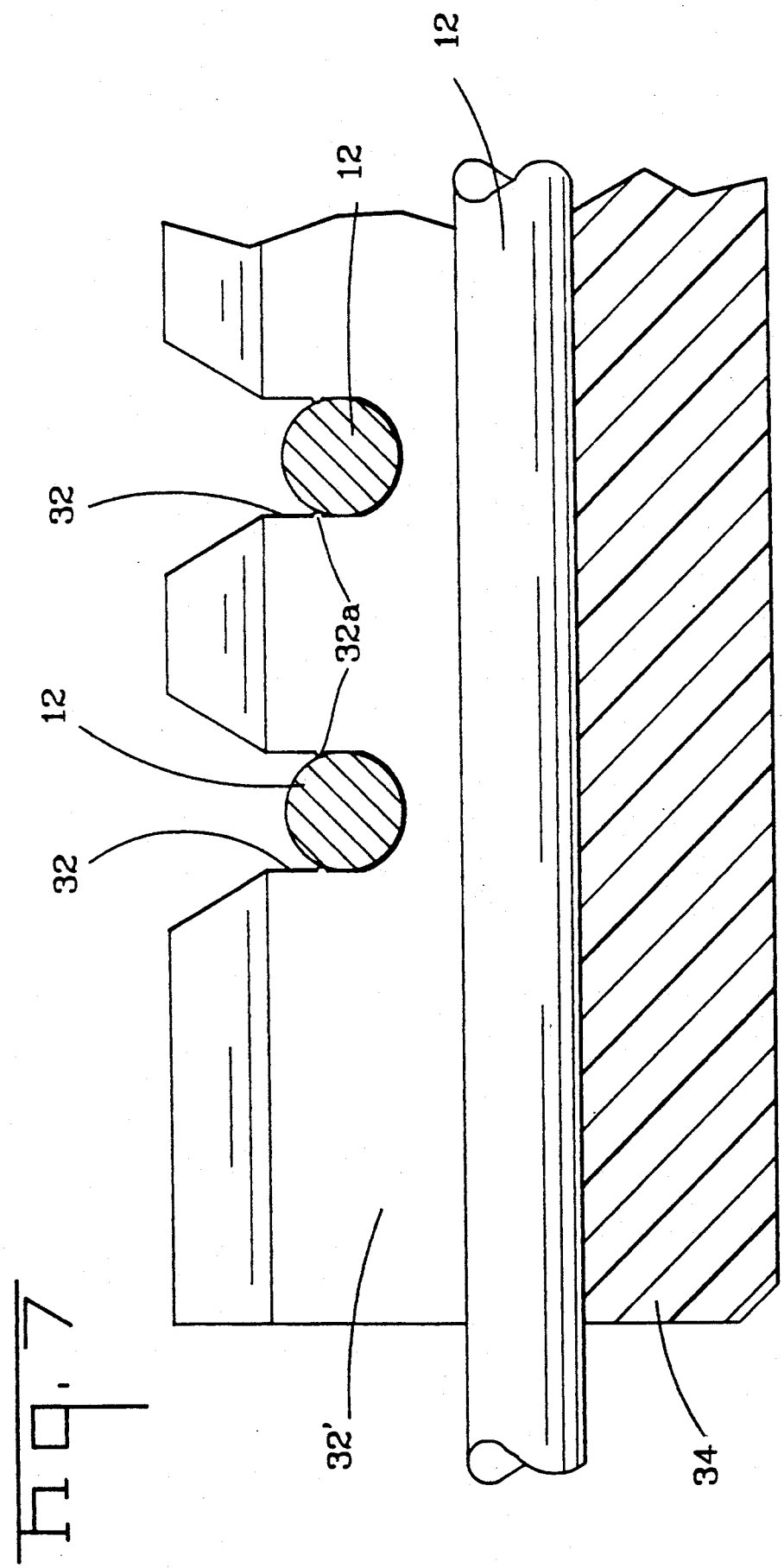

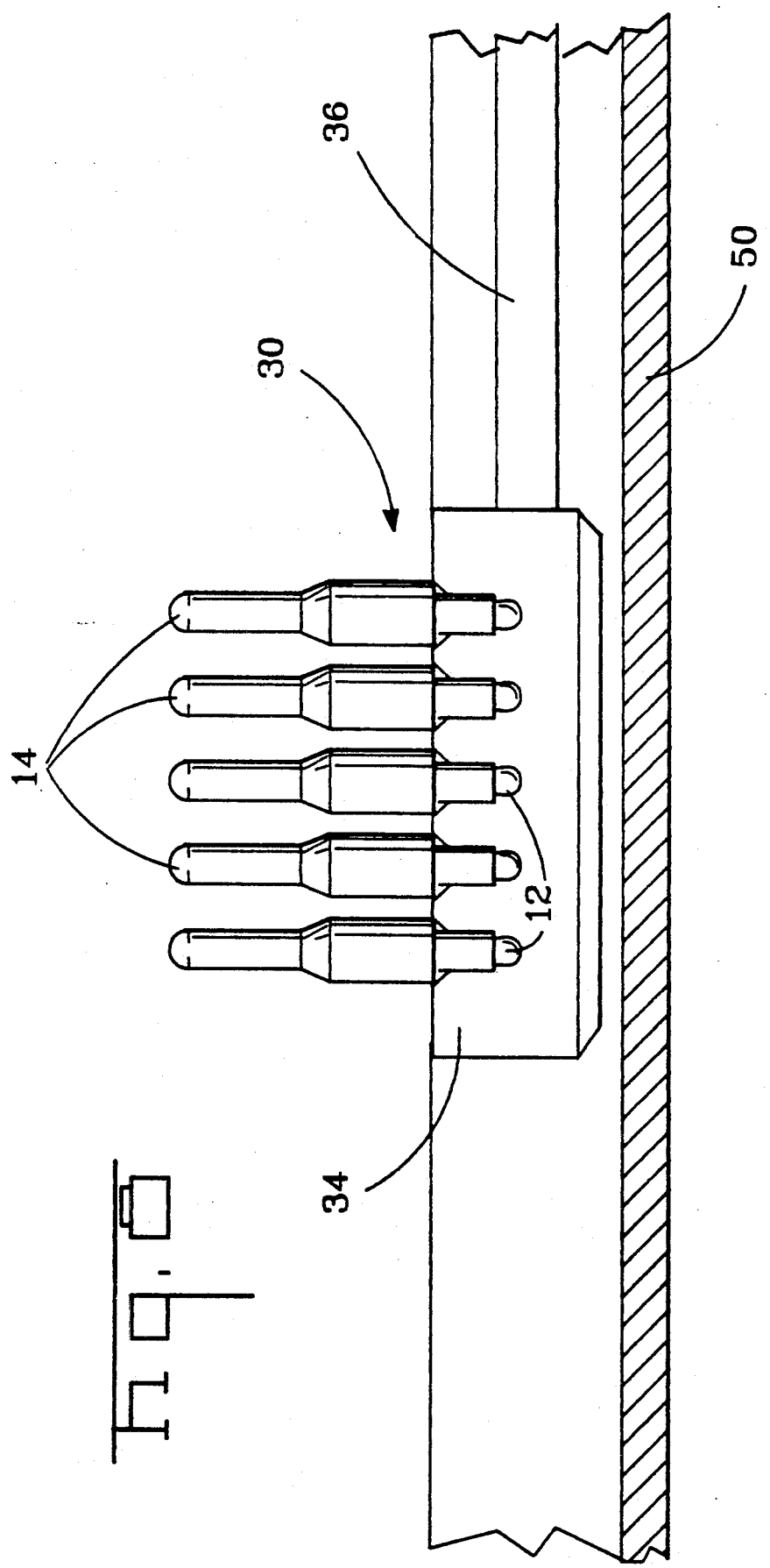

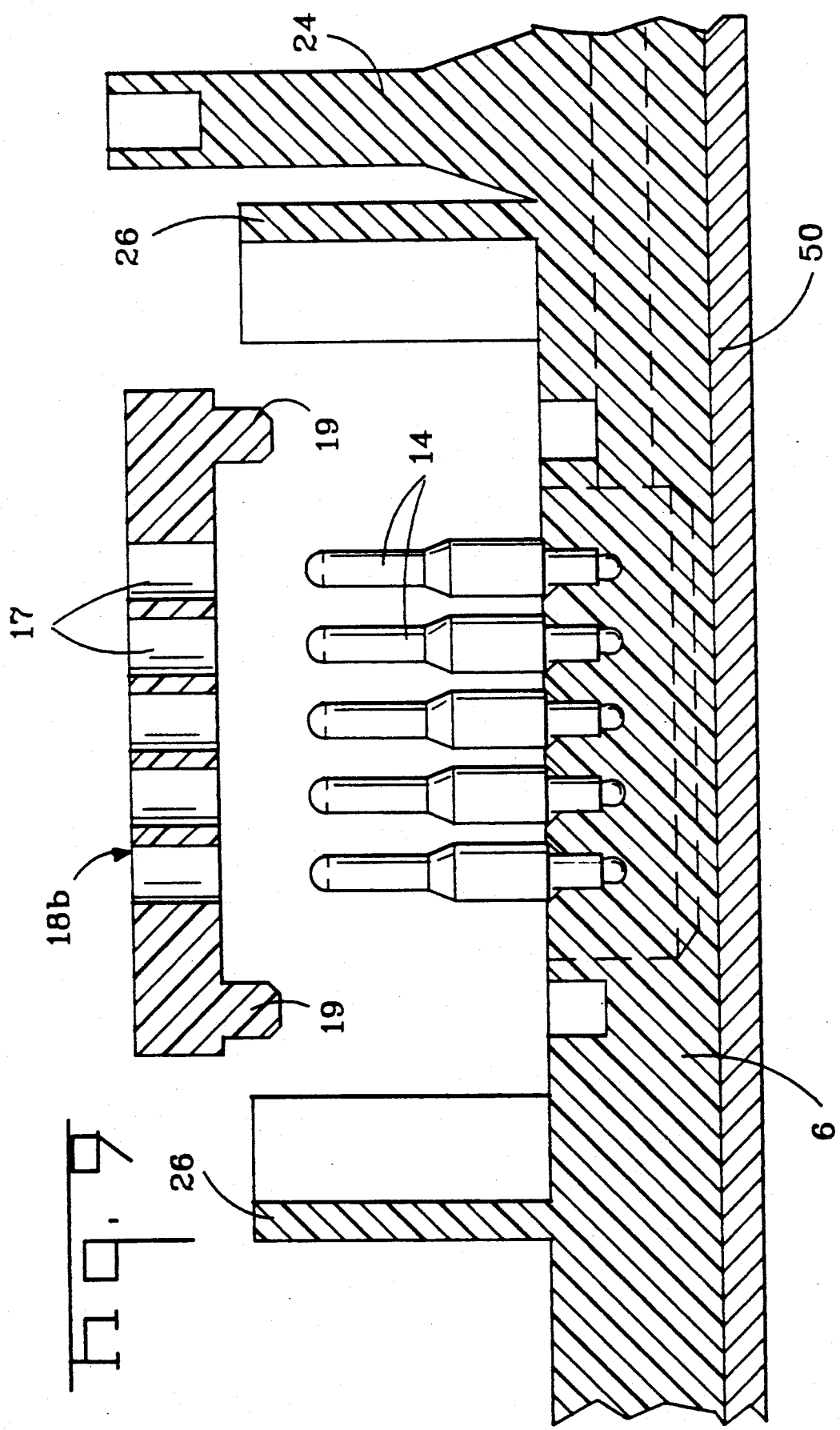

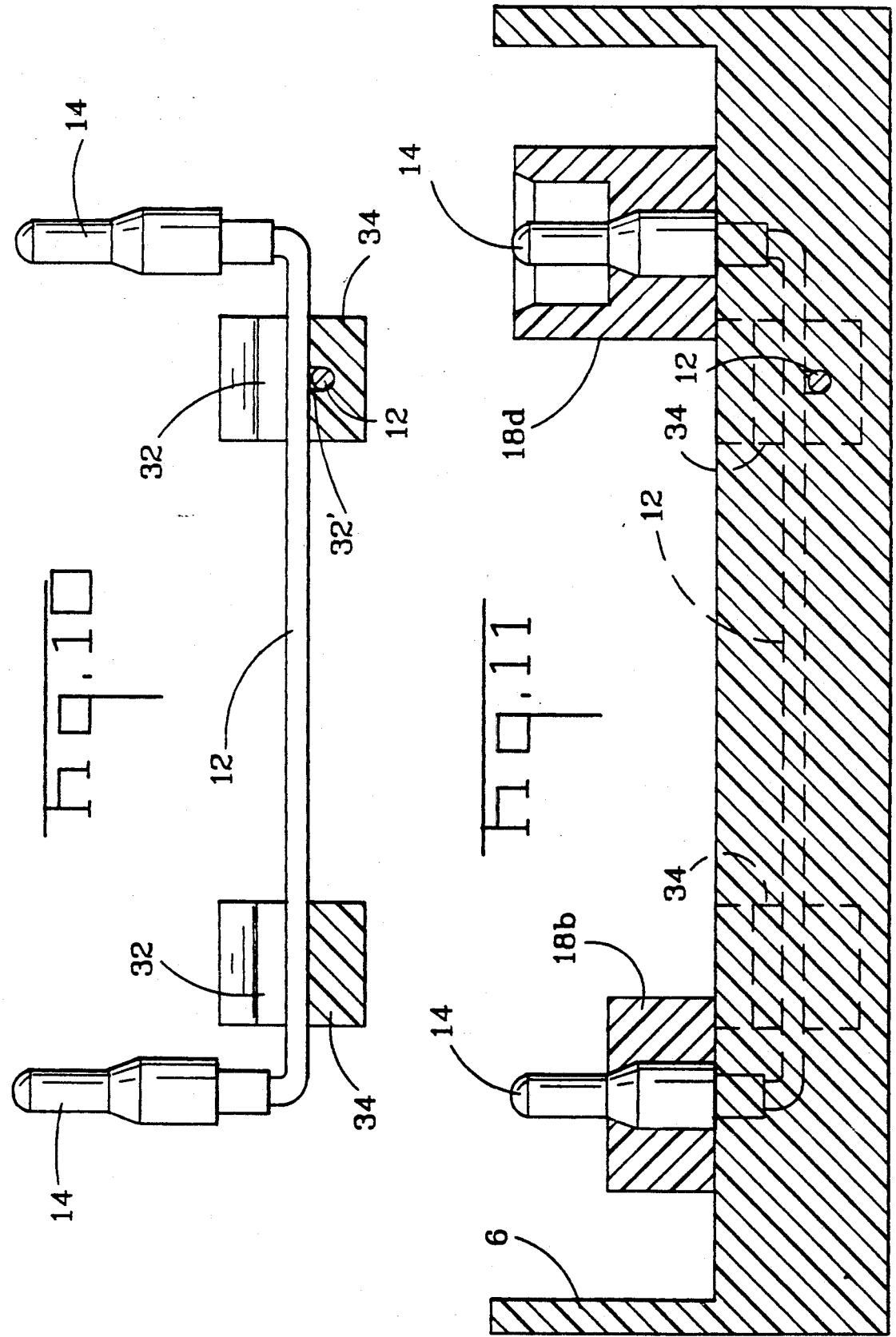

MOLDED ELECTRICAL INTERCONNECTION SYSTEM

BACKGROUND OF THE INVENTION

1. Field of the Invention

This invention relates to a large scale electrical interconnection system in which a plurality of electromechanical components can be electrically interconnected by an electrically conductive grid encapsulated within a insulative molding on which the electrical components can be mounted. More specifically, this invention relates to a harness subassembly in which a circuit panel subassembly comprising an electrically conductive grid, preferably in the form of a wire frame, in encapsulated within a reaction injection molded panel.

2. Description of the Prior Art

Electrical harnesses are typically made of electrical conductor wires which are mostly individually, stranded, and insulated wires with an occasional uninsulated stranded or solid wire utilized for grounding or the like. These wires are typically terminated by electrical terminals and/or connectors and formed into some general shape suitable for inventory and handling by the use of tape or harness ties. Fasteners may or may not be employed to affix the harness to the apparatus in which the harness is used. The harness wires serve the function of supplying power to the various components of such apparatus or signals for either control or machine intelligence purposes and, as mentioned, ground and/or shielding circuit functions. The harness may be a simple one, having only several short wires but a few inches in length utilized to interconnect the components of a simple circuit in an apparatus such as a camera or smoke alarm, or it may have literally hundred of wires terminated in very expensive connectors and utilized to interconnect all of the different devices and components of a complex circuit as in an aircraft. The harness constitutes a subassembly to be loaded into the apparatus on a production line as, for example, with respect to appliances such as washers, dryers, copy machines, stoves, refrigerators and the like; or, added piece-meal as the apparatus moves along a production line. Generally speaking, a harness is a flexible assembly having a non-rigid shape, such as a plurality of discrete wires which are bundle tied together and terminated at ends thereof for interconnection to a panel or other end components. These harnesses are difficult to handle by machine, making it difficult to automate either harness making or harness handling or to employ robotic assembly techniques. Installation errors are common. This fact has frustrated industry for decades and, notwithstanding substantial efforts to automate or robotize harness making or harness manipulation, most harnesses are currently manufactured and installed in a highly labor intensive manner which impacts not only on cost but also on quality. One technique which has been employed is the use of a robot to deploy wires on a harness board. One example is shown in U.S. Pat. No. 4,593,452.

U.S. patent application 134,328 filed Dec. 17, 1987, discloses a method and apparatus for simplifying the wiring of an appliance such as a washer, dryer, copy machine, stove, refrigerator or the like. That application teaches a method of forming electrical wiring harnesses by implanting electrical wires into grooves in a panel laid out in a geometry or pattern suitable to effect wire distribution in the appliance. The panel can be formed from various materials including reaction injection molded plastics. The wires are terminated as desired by using an insulation displacement contact mounted in an insulated body which engages the wires as the wires are rolled in grooves past the insulation displacement contact. However, a single appliance may require a large number of different connectors. U.S. Pat. No. 4,684,765 discloses a bus assembly or harness formed by wires deployed on an insulative plate having a plurality of terminal stations.

Reaction injection molded panels have been used not only as a wire template as described above but have been widely used as structural components. Reaction injection molding differs from conventional molding in several aspects. In reaction injection molding two separate materials are injected into a mold. These component materials react with each other to form a cured part. These two component materials have viscosities which are much lower than a conventional thermo plastic or the reaction product of the two components. For this reason, a reaction injection molding can be conducted at much lower pressure than a conventional molding process, for example, at 100 psi as opposed to 4000 psi. Reaction injection molding also comprises a low temperature process which employs low viscosity materials. Reaction injection molding has been used to fabricate relatively large panels. Large panels fabricated using reaction injection molding processes can constitute three dimensional enclosures and metallic support brackets or screw fasteners can be molded in the reaction injection molded panels. U.S. patent application 324,162 filed Mar. 15, 1989, a continuation of U.S. patent application 272,167 filed Nov. 15, 1988, discloses an appliance cluster block formed using a reaction injection molded material.

SUMMARY OF THE INVENTION

In the instant invention a harness subassembly or circuit panel subassembly for use in connecting a plurality of electrical components or electromechanical components is formed by at least partially encapsulated an electrically conductive grid, which may be in the form of a wire frame, in an insulative molding. Large harness or circuit panel assemblies can be fabricated by using a reaction injection molded process to form the panel or support housing. The electrical conductors encapsulated within the reaction injection molded insulative housing can thus extend between the positions at which the electromechanical components are to be mounted. The components can also be mounted directly on the housing. The components attached to the harness subassembly can be electrically terminated to the electrical conductors in the insulative panel at locations where the conductors are exposed. Electrical terminals can be affixed to the electrical conductors, for example, by crimping the standard terminals to the ends of traces within a lead frame, before or after the electrically conducted grid is encapsulated within the reaction injection molded insulative material. Mating connector housings can be attached to the reaction injection molded insulative panel so that conventional electrical connectors and terminals can be mated directly to the harness panel subassembly.

BRIEF DESCRIPTION OF THE DRAWINGS

FIG. 6 is a view of the electrically conductive grid showing the individual wires held in position by the wire organizing frame.

FIG. 7 is a view showing the manner in which wires extending in transverse direction can be positioned one above another in a wire retaining block.

FIG. 8 is a view showing the wire organizing frame with the electrically conductive grid positioned therein located within a mold prior to injection of reaction injection molding materials into the mold.

FIG. 9 is a view similar to FIG. 8 but showing the formation of the reaction injection molded insulative panel in surrounding relationship to the wires forming the electrically conductive grid. FIG. 9 also shows a separate insulative housing exploded above terminals held in place by the insulative panel.

FIG. 10 is a view taken along section 10—10 in FIG. 6 showing a single wire extending between two wire retaining blocks.

FIG. 11 is a sectional view taken along section lines 11—11 in FIG. 1 showing the portion of the electrically conductive grid of FIG. 10 imbedded within the insulative panel with the terminals extending into connector housings secured to the insulative panel.

DETAILED DESCRIPTION OF THE PREFERRED EMBODIMENTS

Figure 1:
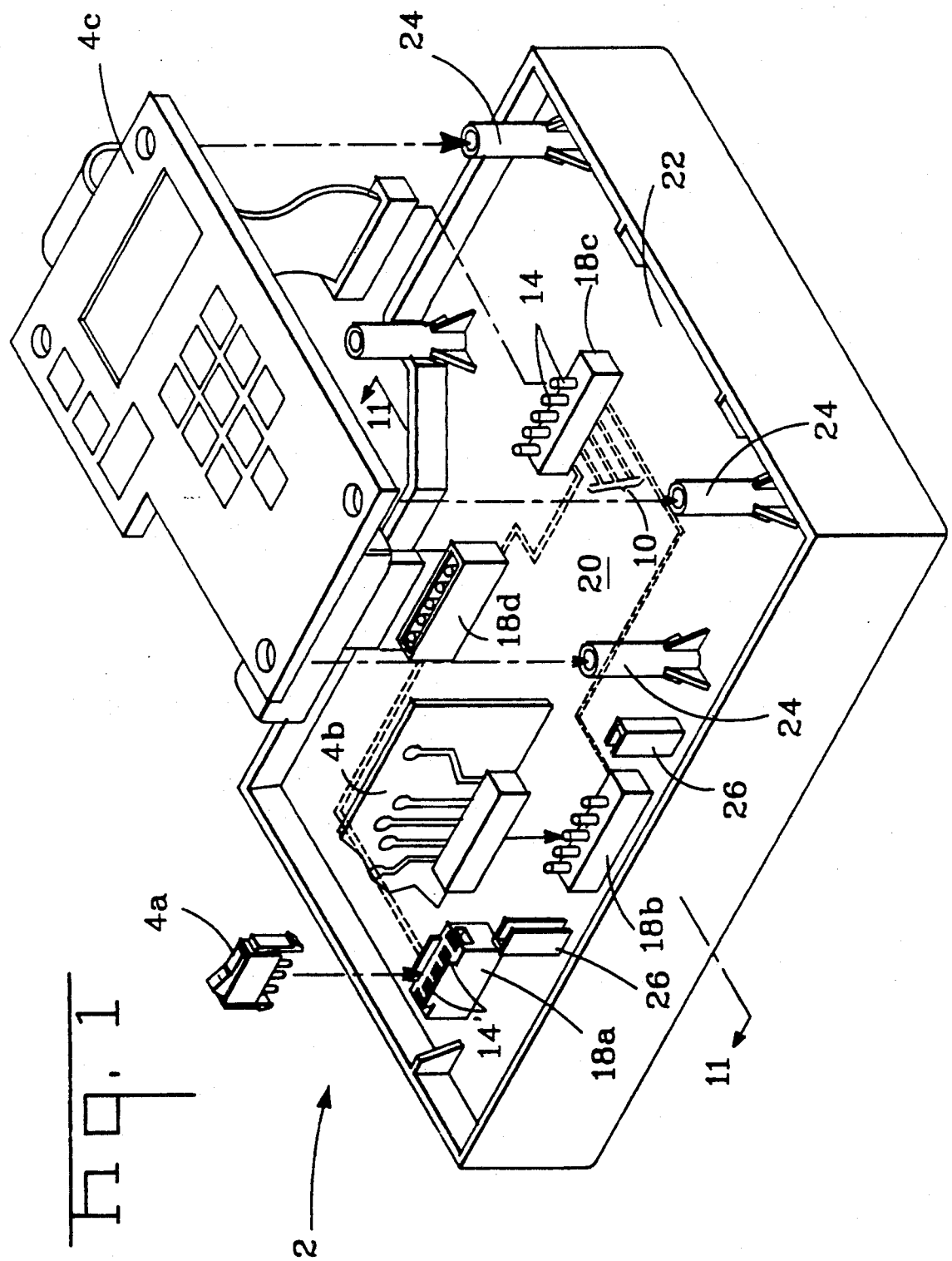
FIG. 1 is a prospective view showing a molded housing in which a electrically conductive grid is encapsulated to form a molded electrical interconnection system.

The preferred embodiment of this invention comprises a electrical circuit panel subassembly 2 comprising an electrically conductive grid 10 imbedded or encapsulated within a housing 6 formed of a reaction injection molded (RIM) material. In the preferred embodiment of this invention this housing 6 comprises an exterior portion of a electrical component such as a cover or a base pan for an electrical appliance, a copier, the dashboard of an automobile, a personal computer or any other apparatus in which components are assembled to an electrical harness. The housing panel 6 comprising the preferred embodiment of this invention can be fabricated using a conventional urethane base RIM material to which suitable fillers have been added to provide appropriate dielectric properties and flammability. The circuit panel subassembly 2 shown in FIG. 1 is suitable for interconnecting a plurality of electrical components or subcomponents 4 positioned at spaced apart locations on the interior of the housing 6. These electrical components 4 can be mounted directly on the interior of the panel and electrically connected by terminals 14 secured to the ends of wires 12 which form the electrically conductive grid 10 encapsulated within the exterior housing 6.

Figure 2:
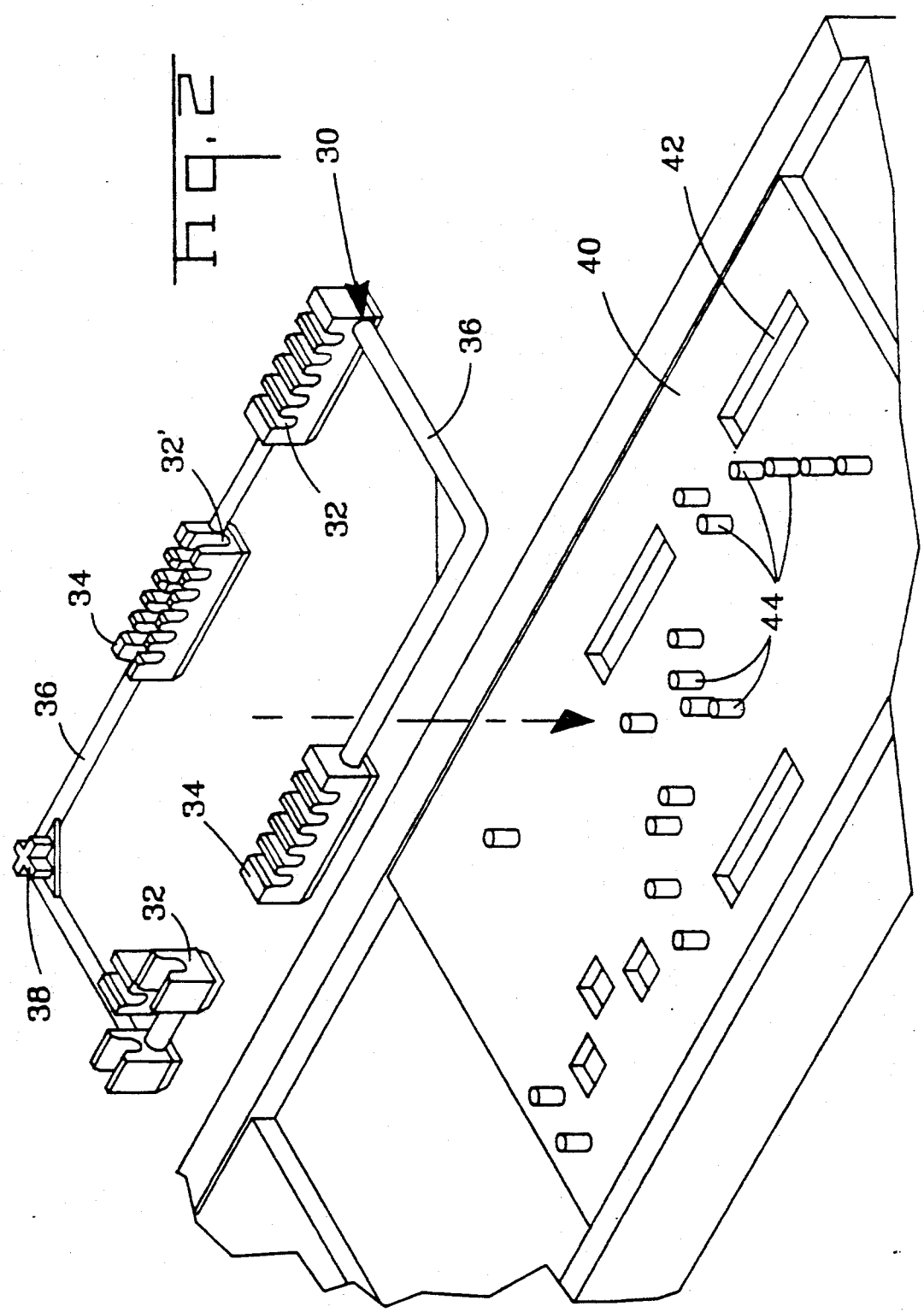
FIG. 2 shows a molded frame for forming the electrically conductive grid used in the electrical interconnection system as the frame is positioned within a template.

The electrically conductive grid 10 comprises a plurality of wires 12 formed into a pattern extending between spaced apart locations at which electrical components 4 are positioned on the housing 6. The wires 12 are laid out into the pattern forming the electrically conductive grid 10 by the use of a wire organizing frame 30. FIG. 2 shows the wire organizing frame 30 as it is positioned within a wire forming template 40. In the preferred embodiment of this invention, the frame 30 comprises an insulative member preferably fabricated from the same reaction injection molded material used to form the housing 6. As shown in FIG. 2, this frame 30 comprises a plurality of wire retaining blocks 34 joined by integral runners 36. Each of the wire retaining frame blocks 34 includes one or more grooves 32. The frame 30 also has an appropriately keyed pick up member 38 which permits manipulation of frame 30 by a robot. Frame 30 can be positioned within template 40 by a robot with the wire retaining blocks positioned within appropriate slot 42. Pins 44 extending from the upper surface of the template 40 are used during the wire forming operation.

Figure 3:
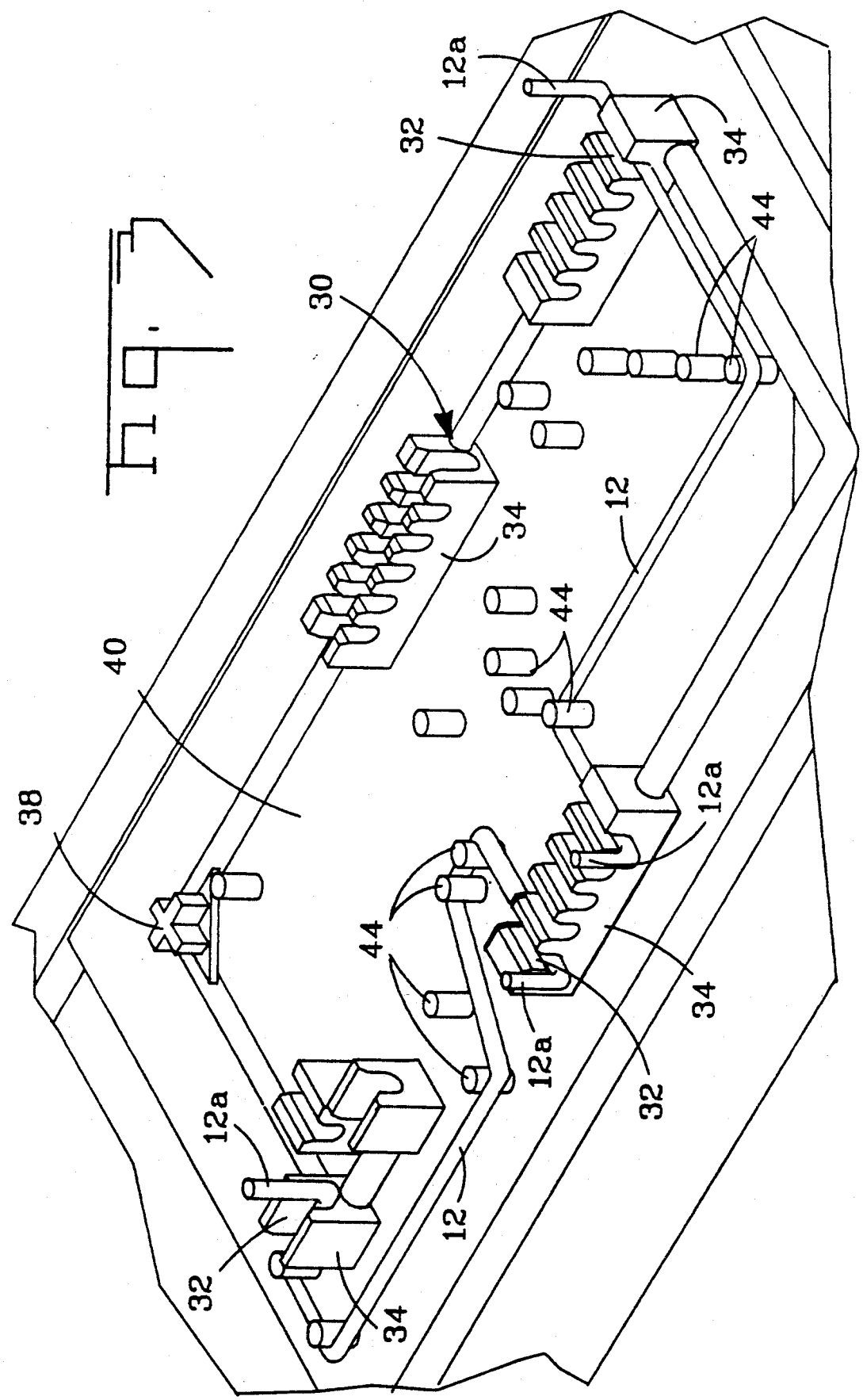
FIG. 3 shows a frame positioned within the template and depicts the manner in which the electrically conductive grid is fabricated by placing wires along the template and positioned in wire retaining sections of the frame.
Figure 4:
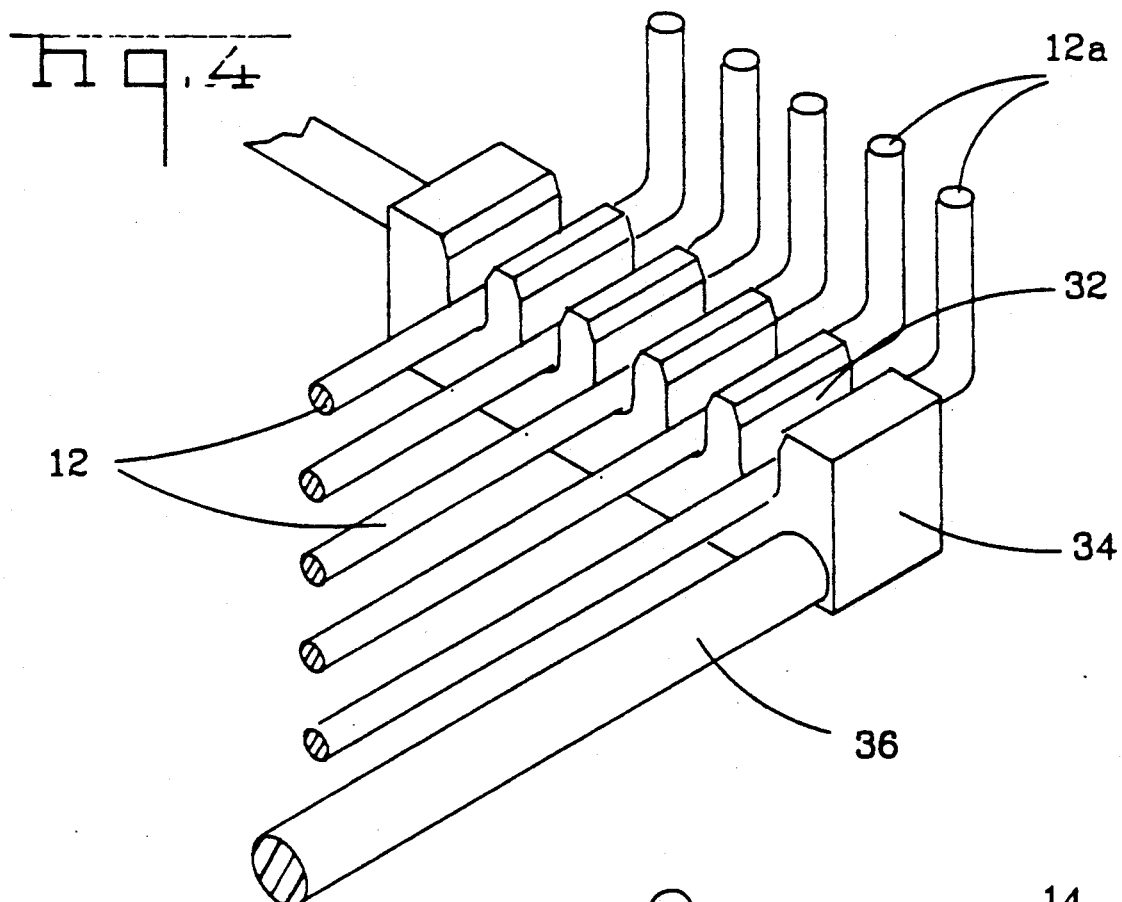
FIG. 4 is a view of a portion of the wire organizing frame showing the manner in which individual wires are held in place within grooves in a single wire retaining block.
Figure 5:
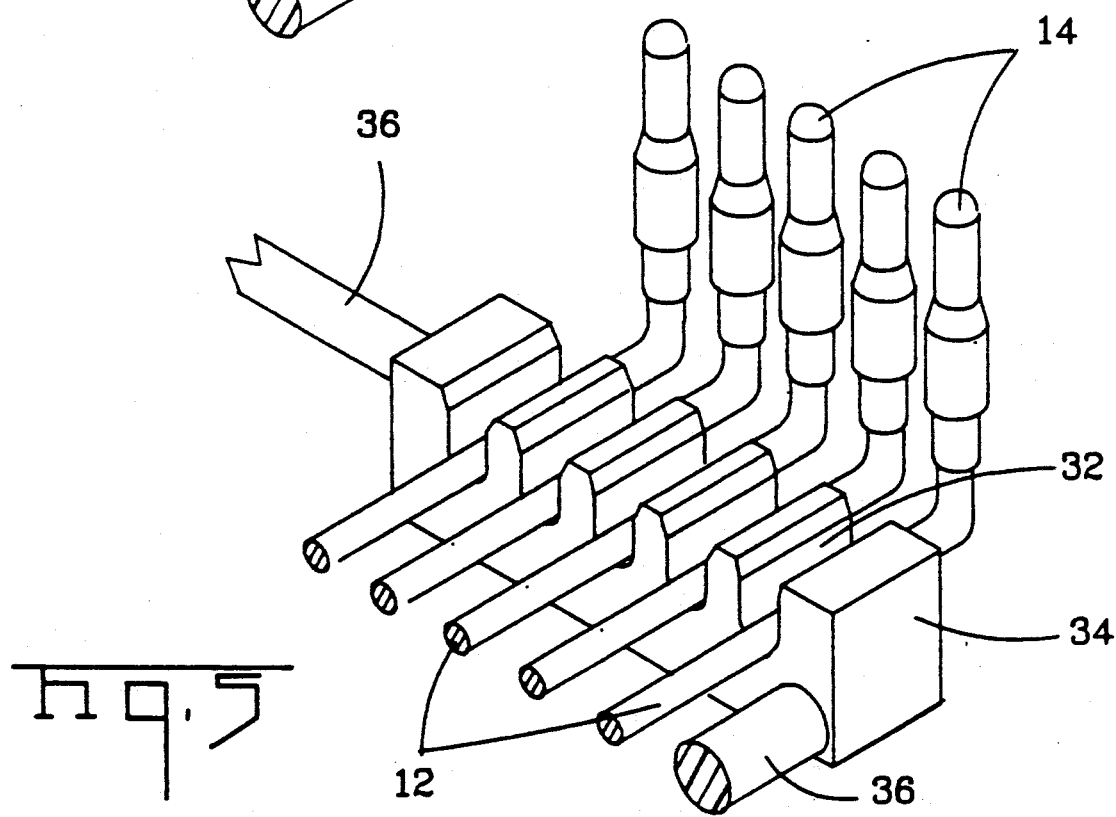
FIG. 5 is a view similar to FIG. 4 showing terminals attached to upright ends of the wires adjacent the wire retaining block.

FIG. 3 shows the manner in which individual wires 12 are deployed in a pattern and secured in position in the pattern by the wire organizing frame 30 positioned within the wire organizing template 40. In the preferred embodiment of this invention, bare copper wire from a continuous source is laid into grooves 32 in the wire retaining blocks 34 and laced around pins 44 on the template by use of a conventional robot equipped with suitable wire pick up and cutting mechanisms of conventional construction. Robots capable of exerting a force of 65 pounds in the X and Y direction and 40 pounds of force in the Z direction, which are of conventional construction, are suitable for each of the robotic manipulations required to form the housing 6. In the preferred embodiment of this invention, the majority of the length of the wires 12 are laid out, either in common plane or parallel to a common plane so that the electrically conductive grid 10 is substantially planar. It would be understood, however, that this apparatus and method permits wire crossovers with one wire extending above another in a transverse direction, so that the major portion of the electrically conductive grid need not be totally confined to a single plane even though the majority of a grid containing crossovers would still remain substantially planar. As shown in FIG. 3, the bare copper wires 12 fit within the grooves 32 to affix the wires to the frame 30, thus securing the wires in position within the pattern of the electrically conductive grid. Robotic manipulation of the wires is suitable to press fit the wires within the grooves of the frame.

In the preferred embodiment of this invention, the ends 12A of the wires 12 are bent upwardly from the common plane containing the major portion of the electrically conductive grid 10. These upwardly bent wire ends 12A are located adjacent the wire retaining block 34. Wires 12 can be bent upwardly in this manner by the robot. Standard closed barrel or open barrel terminals 14 can then be robotically crimped to the solid wires 12. Terminals 14 can be crimped to the wire ends 12A while the electrically conductive grid remains positioned in template 40 or after removal of the grid 10 from the template. It should be understood, however, that other conventional means of attaching terminals to wires can be employed. For example, the wire ends could remain planar and could be crimped to the wires using a standard applicator tool. Even if the terminals 14 are attached to the wire ends 12A while the wire ends 12A remain coplanar with the remainder of wires 12, the preferred embodiment of this invention contemplates that the terminals 14 would extend at right angles to the plane of the remainder of the grid 10 and wires 12. Thus, if the terminals 14 are attached while the wire ends remain coplanar, the wires would preferably, though not necessarily, be bent upward after the terminals were attached thereto.

FIG. 6 shows a completed electrically conductive grid 10 suitable for use in the apparatus shown in FIG. 1. Wires 12 and grid 10 are secured in their appropriate pattern within the wire organizing frame 30 with pin terminals 14 attached the end of plurality of wires 12. Note that other terminals, such as receptacle terminals 14 can also be employed. The electrically conductive grid 10 and the frame 30 can be handled as a single subassembly, such as that shown in FIG. 6, by a conventional robot. In the preferred embodiment of this invention, the wires 12 are held within the grooves 32 of the frame 30 by barbs 32A shown in FIG. 7. Retention of the wires 12 within the grooves 32 permits the assembly to be handled as a single unit. FIG. 7 also shows the manner in which a cross-over can be formed by inserting one wire 12 into a groove 32 that extends transversely to and below other grooves 32 in the same retention block 34.

After the electrically conductive grid 10 is affixed to the frame 30, this entire subassembly can be positioned within a mold 50 as shown in FIG. 8. This mold 50 need only be suitable of handling the relatively low pressures and temperatures needed to fabricate a reaction injection molded structure of conventional construction. With the electrically conductive grid 10 and the frame 30 positioned within the mold 50, a reaction injection molded panel 20 can be fabricated. This reaction injection molded panel 20 would, in the preferred embodiment of this invention, correspond to at least a portion of the housing 6 of the apparatus in which this circuit panel subassembly or harness is employed. FIG. 9 shows a cross-sectional representation of a portion of this reaction injection molded panel. Panel 20 comprises a generally planar member having a base with integral portions extending relatively transversely thereto for mounting components on the panel. When the panel 20 is formed by injecting reaction injection molding materials into the mold 50 the electrically conductive grid 10 is substantially surrounded by the RIM materials forming panel 20. The frame 30 is also substantially encapsulated within the RIM material forming the panel 20 and since in the preferred embodiment of the invention, this frame 30 also is fabricated from a RIM material, the frame 30 can be said to now form an integral portion of panel 20.

Portions of the electrically conductive grid 10 however, remain exposed for termination to components 4. These exposed portions of the electrically conductive grid eventually comprise the wire ends 12A crimped to terminals 14. These exposed terminals 14 are positioned on the panel where components 4 are to be mounted. In the preferred embodiment of this invention these terminals extend generally perpendicular to the base of the reaction injection molded panel and are exposed on only the interior surface of panel 20. Note that in the preferred embodiment of this invention none of the electrically conductive grid is exposed on the exterior of the panel 20, thus permitting panel 20 to be used as a housing 6. An input/output connector could also be positioned on the exterior surface of the housing, if desired. With the terminals 14 exposed on the interior surface of the housing panel 20 as shown in FIGS. 9 through 11, insulative connector housings 18 can be secured to the interior surface of the panel 20. These connector housings 18 provide for precise alignment and provide matability with conventional connectors located on the various components 4. The insulative connector housings 18 can be of substantially conventional configuration with the terminals 14 received within wire retaining passages 17. Integral fasteners 19 suitable for attaching the housings 18 to the panel 20 extend along the lower surface of the connections 18. As shown in FIG. 9, protruding fasteners 19 can be received within holes in the panel 20. These housings can be secured to the panel 20 by the use of a conventional adhesive or by other conventional means. In the preferred embodiment of this invention, these housings 18 can be fabricated from a conventional thermoplastic material so that the housings 18 can provide the function and performance of other conventional or mating connector housings.

A housing 6 such as that shown in FIG. 1 can be fabricated using the techniques depicted FIGS. 2 through 11. Once fabricated in this manner, different components such as switch 4A, printed circuit board 4B, and an electro-luminesent display input device 4C can be attached to the circuit panel subassembly at spaced apart locations. Mechanical support means such as printed circuit board guides 26 or mounting supports 24 can be fabricated as integral portions of the reaction injection molded panel 20. Different connector housings such as the receptacle housing 18, pin headers 18B and 18C and shrouded pin header 18D can employed as desired. Once this circuit panel subassembly has been fabricated, these various components can be directly mounted to the housing of the electrical apparatus which contains the electrically conductive grid 10 which form the interconnecting harness for the electromechanical assembly. By fabricating the harness assembly in this manner, the harness is now suitable for robotic manipulation since all the various elements are held in place by the RIM material forming the housing 6. Furthermore, no additional materials have been employed since the RIM housing panel would comprise an essential element of the electromechanical structure and wires forming the harness would have been needed in any event. Also, electrical connectors attachable to the ends of the harness would be needed. Furthermore, not only can the harness be robotically assembled, but various components can also be easily robotically assembled to the housing 6.

It should be understood that only the preferred embodiment of this invention is depicted herein. For example, although the electrically conductive grid 10 can be simply and economically fabricated using individual wires 12, the electrically conductive grid could also comprise a stamped and formed lead frame. Since the harness assembly of this invention is especially suitable for large scale devices, a large lead frame would be required. The larger lead frames could only be stamped with large presses of the type not normally used in the fabrication of electrical components. Such large lead frames could alternatively be fabricated using a water jet principle in which an abrasive fluid jet could be used to simultaneously cut several layers of electrically conductive metal to form a plurality of identical lead frames. Therefore, the following claims are not limited to the preferred embodiment of the invention depicted herein.

We claim:

1. A molded electrical interconnection system comprising:

a template having mounted thereon pins and a separable wire organizing frame which includes wire retaining blocks with grooves, a wire harness having a plurality of bare conductors laced to said frame and pins to form electrical grids, said conductors being either in a common plane or parallel to said common plane said conductors contacting said grooves and pins;

free ends of said conductors being bent normal to said common plane with terminals attached thereto; and an encapsulant formed from reaction injection molded material encapsulating said template, and wire harness but not the free ends said free ends interconnecting electrical components mounted to said system.

* * * * *